United States Patent
Koo et al.

(10) Patent No.: US 9,508,952 B2
(45) Date of Patent: Nov. 29, 2016

(54) ORGANIC LIGHT EMITTING DISPLAY DEVICE AND METHOD OF MANUFACTURING THE SAME

(71) Applicant: Samsung Display Co., Ltd., Yongin, Gyeonggi-Do (KR)

(72) Inventors: Yong-Kyoung Koo, Yongin (KR); Kwang-Seong Kim, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/548,623

(22) Filed: Nov. 20, 2014

(65) Prior Publication Data

US 2015/0144917 A1    May 28, 2015

(30) Foreign Application Priority Data

Nov. 22, 2013 (KR) .................. 10-2013-0142584

(51) Int. Cl.
*H01L 51/52* (2006.01)
*H01L 27/32* (2006.01)

(52) U.S. Cl.
CPC ....... *H01L 51/5246* (2013.01); *H01L 27/3246* (2013.01); *H01L 51/525* (2013.01); *H01L 2227/323* (2013.01)

(58) Field of Classification Search
CPC ............... H01L 2227/323; H01L 27/3246; H01L 27/3253; H01L 51/5246; H01L 51/56
USPC ................................. 313/498–512
See application file for complete search history.

(56) References Cited

U.S. PATENT DOCUMENTS

| | | | |
|---|---|---|---|
| 7,537,504 B2 | 5/2009 | Becken et al. | |
| 2003/0062518 A1* | 4/2003 | Auch et al. | 257/40 |
| 2004/0263072 A1* | 12/2004 | Park et al. | 313/509 |
| 2005/0001545 A1 | 1/2005 | Aitken et al. | |
| 2006/0065960 A1* | 3/2006 | Maruyama et al. | 257/678 |
| 2007/0170605 A1* | 7/2007 | Lee et al. | 264/1.1 |
| 2007/0170859 A1* | 7/2007 | Choi et al. | 313/512 |
| 2007/0177069 A1* | 8/2007 | Lee | 349/56 |
| 2007/0205719 A1* | 9/2007 | Kim | 313/512 |
| 2007/0232182 A1 | 10/2007 | Park | |

(Continued)

FOREIGN PATENT DOCUMENTS

KR  10-2006-0005369 A    1/2006
KR     100658758 B1 * 12/2006

(Continued)

*Primary Examiner* — Donald Raleigh
*Assistant Examiner* — Kevin Quarterman
(74) *Attorney, Agent, or Firm* — Knobbe Martens Olson & Bear LLP

(57) ABSTRACT

An organic light emitting display device includes a first substrate, a second substrate, and an array of organic light emitting elements formed over the first substrate and interposed between the first and second substrate. The array comprises a pixel defining layer. The organic light emitting display device further includes a recess formed into the pixel defining layer, a sealing member, and a reinforcing member. The sealing member is formed along the edges of the first and second substrates and interconnects the first and second substrates. The reinforcing member comprises a first portion positioned in the recess and a second portion projected outside the recess toward the second substrate such that the second portion of the reinforcing member is capable of supporting the second substrate when the second substrate is pressed toward the first substrate by an external force.

17 Claims, 4 Drawing Sheets

(56) References Cited

U.S. PATENT DOCUMENTS

| | | | |
|---|---|---|---|
| 2010/0117067 A1* | 5/2010 | Sin et al. ..................... | 257/40 |
| 2010/0244057 A1 | 9/2010 | Ryu et al. | |
| 2011/0114991 A1 | 5/2011 | Lee | |
| 2012/0235557 A1 | 9/2012 | Lee | |
| 2014/0027791 A1* | 1/2014 | Cho ..................... | H01L 33/44 |
| | | | 257/88 |

FOREIGN PATENT DOCUMENTS

| | | |
|---|---|---|
| KR | 10-0732817 B1 | 6/2007 |
| KR | 10-2010-0106796 A | 10/2010 |
| KR | 10-2011-0054768 A | 5/2011 |
| KR | 10-2012-0105252 A | 9/2012 |

* cited by examiner

ORGANIC LIGHT EMITTING DISPLAY DEVICE AND METHOD OF MANUFACTURING THE SAME

CROSS-REFERENCE TO RELATED APPLICATION

This application claims priority to and the benefit of Korean Patent Application No. 10-2013-0142584, filed on Nov. 22, 2013, in the Korean Intellectual Property Office, the entire contents of which are incorporated herein by reference in their entirety.

BACKGROUND

Field

The present disclosure relates to an organic light emitting display device and a method of manufacturing the same.

Description of the Related Art

An organic light emitting display device a flat panel display device in which an organic emission layer is positioned between electrodes facing each other. Electrons injected from one electrode and holes injected from the other electrode are combined in the organic emission layer to excite luminescent molecules of the organic emission layer, and as the excited molecules are subsequently returned to a ground state, energy is released to emit light.

Because organic light emitting display devices have excellent visibility, are devised to be lighter and thinner, and are driven with a low voltage, they are promising candidates as next-generation display devices.

However, organic light emitting display devices have characteristics of being degraded by ambient oxygen and moisture infiltration.

In order to address such a problem, an organic light emitting element tends to be sealed by using an inorganic sealant such as frit. In such a frit encapsulation structure, a substrate and a sealing substrate may be completely sealed by curing molten frit, and thus, the organic light emitting element may be more effectively protected without having to use a moisture absorbent material.

Meanwhile, due to the brittleness of the frit material used in the frit encapsulation structure, when external impact is applied, stress is concentrated on a bonding surface between the frit and the substrate to cause cracks to be generated in the bonding surface and spread to the entire substrate.

SUMMARY

An embodiment of the present invention relates to an organic light emitting display device and a method of manufacturing the same, capable of increasing mechanical strength and effectively blocking ambient oxygen and moisture.

An organic light emitting display device according to an embodiment of the present invention may include a first substrate, a second substrate, and an array of organic light emitting elements formed over the first substrate and interposed between the first and second substrate. The array may comprise a pixel defining layer. The organic light emitting display device may further include a recess formed into the pixel defining layer, a sealing member, and a reinforcing member. The sealing member may be formed along the edges of the first and second substrates and interconnect the first and second substrates. The reinforcing member may comprise a first portion positioned in the recess and a second portion projected outside the recess toward the second substrate such that the second portion of the reinforcing member is capable of supporting the second substrate when the second substrate is pressed toward the first substrate by an external force.

An organic light emitting display device according to an embodiment of the present invention includes: a substrate having at least one thin film transistor (TFT); an organic light emitting element having a first electrode electrically connected to the TFT, a pixel defining layer formed on the first electrode and having an opening partially exposing the first electrode, an organic emission layer formed on the first electrode, and a second electrode formed on the organic emission layer; a sealing unit sealing the organic light emitting element along the edges of the substrate; and a reinforcing unit positioned within a hole partially formed in the pixel defining layer and enhancing strength of the substrate.

The reinforcing unit may be formed of a material identical to that of the sealing unit.

The reinforcing unit and the sealing unit may be formed of glass frit.

The second electrode may include an opening formed in a portion corresponding to the reinforcing unit.

The reinforcing unit may be formed in a non-light emitting region of the substrate on the pixel defining layer.

Two or more reinforcing units may be formed to be spaced apart from one another at a predetermined interval on the pixel defining layer.

The reinforcing unit may be formed to be applied to the interior of the hole of the pixel defining layer through a printing method.

The pixel defining layer may be an organic layer.

A method of making an organic light emitting display device according to an embodiment of the present invention may include: providing an intermediate device comprising a first substrate, a second substrate, and an array of organic light emitting elements formed over the first substrate and interposed between the first and second substrates, the array comprising a pixel defining layer and a recess formed into the pixel defining layer; forming a reinforcing member comprising a first portion and a second portion such that the first portion is received in the recess and the second portion projects outside the recess toward the second substrate; and forming a sealing member along edges of the first and second substrates to interconnect the first and second substrates.

A method for manufacturing an organic light emitting display device according to another embodiment of the present invention, includes: providing a substrate including a thin film transistor (TFT); forming a first electrode electrically connected to the TFT; forming a pixel defining layer on the first electrode and having an opening partially exposing the first electrode; forming an emission layer and a second electrode on the first electrode; partially forming a hole in the pixel defining layer; and forming a sealing unit sealing an organic light emitting element having the emission layer along edges of the substrate and simultaneously forming a reinforcing unit formed of glass frit in the hole.

The method may further include: a melting operation to irradiate laser to the sealing unit and the reinforcing unit.

The reinforcing unit may be formed of a material identical to that of the sealing unit.

The sealing unit may be formed of glass frit.

The second electrode may be patterned to include an opening formed in a portion corresponding to the reinforcing unit.

The reinforcing unit may be formed in a non-light emitting region of the substrate on the pixel defining layer.

Two or more reinforcing units may be formed to be spaced apart from one another at a predetermined interval on the pixel defining layer.

The reinforcing unit may be formed to be applied to the interior of the hole of the pixel defining layer through a printing method.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it may be the only element between the two elements, or one or more intervening elements may also be present. Like reference numerals refer to like elements throughout.

DETAILED DESCRIPTION

Figure 1:
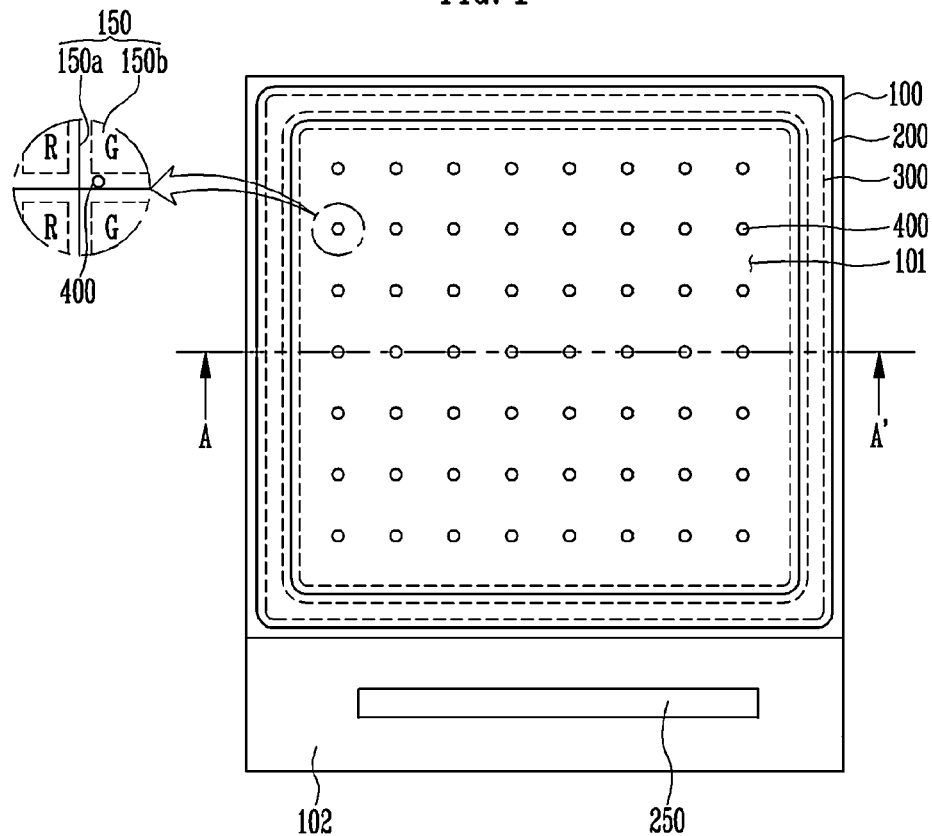
FIG. 1 is a view schematically illustrating an organic light emitting display device according to an embodiment of the present invention.

Details of embodiments are included in detailed descriptions and drawings.

The advantages and features of the present disclosure and methods for achieving these will be clarified in detail through embodiments described hereinafter in conjunction with the accompanying drawings.

However, embodiments of the present invention may, however, be implemented in many different forms and should not be construed as being limited to the embodiments set forth herein. Rather, these embodiments are provided so that this disclosure will be thorough and complete, and will fully convey the scope of the invention to those skilled in the art and are defined by the claim coverage of the present invention. Throughout the specification, the same reference numerals will be used to designate the same or like components.

In order to clarify the present invention, parts that are not connected with the description will be omitted, and since sizes and thickness of respective components are arbitrarily shown for the description purpose, the present invention is not necessarily limited to the illustration.

In the drawings, the thickness of layers, films, regions, etc. are exaggerated for clarity. Also, in the drawings, the thickness of some layers and regions are exaggerated for the sake of brevity.

It will be understood that when an element such as a layer, film, region, or substrate is referred to as being "on" another element, it may be directly on the other element or intervening elements may also be present.

Figure 2:
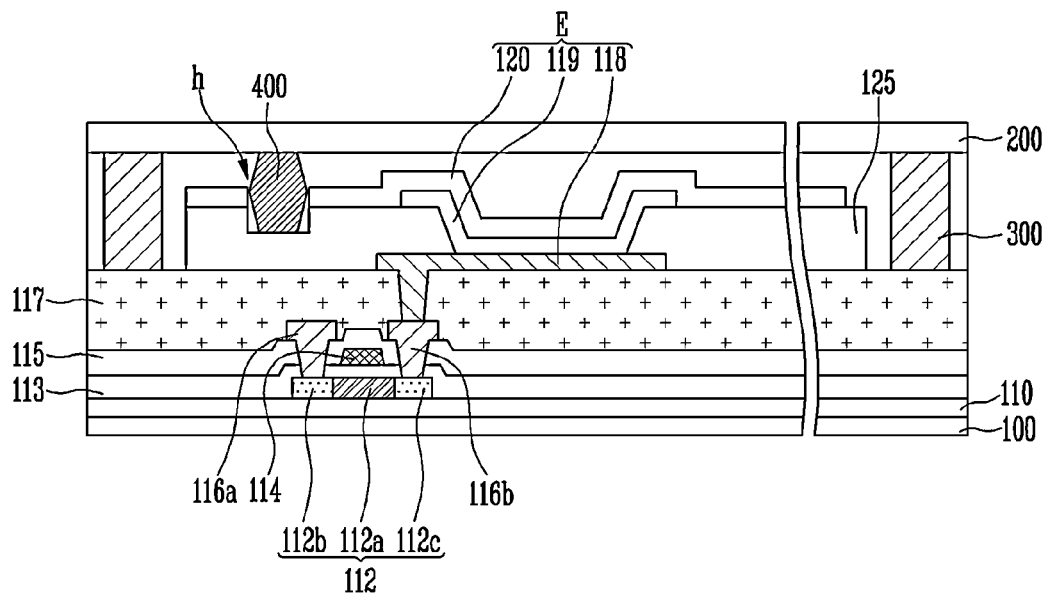
FIG. 2 is a cross-sectional view of the organic light emitting display device of FIG. 1 taken along line A-A' in FIG. 1.

FIG. 1 is a view schematically illustrating an organic light emitting display device according to an embodiment of the present invention, and FIG. 2 is a cross-sectional view of the organic light emitting display device of FIG. 1 taken along line A-A' in FIG. 1.

Hereinafter, an organic light emitting element provided in a substrate and characteristics of first and second seals will be described with reference to FIGS. 1 and 2. In the present disclosure, an active matrix organic light emitting display device using a top gate type driving transistor will be described as an example, but the present disclosure is not limited thereto.

Referring to FIGS. 1 and 2, an organic light emitting display device according to an embodiment of the present invention includes a first substrate 100 including a display region 101 and a non-display region 102 and a second substrate 200 facing the first substrate 100.

The first substrate 100 includes a plurality of pixel units P composed of a light emitting unit 150b configured to generate light within the display region 101 and a non-light emitting unit 150a in which driving elements (a thin film transistor, a capacitor, and the like) providing electrical signals to the light emitting unit 150b are formed.

The first and second substrates 100 and 200 may be glass substrates, but the present disclosure is not limited thereto and the first and second substrates 100 and 200 may be substrates formed of metal or plastic.

The second substrate 200 may be smaller than the first substrate 100, and thus, a portion of the first substrate 100 may be exposed. A driving unit 250 such as an integrated circuit (IC), or the like, may be provided in the non-display region 102 as an exposed portion of the first substrate 100.

The first substrate 100 includes a buffer layer 110, a semiconductor layer 112 formed on the buffer layer 110 and including an active layer 112a and source and drain regions 112b and 112c, a gate insulating layer 113 formed on the semiconductor layer 112, a gate electrode 114 formed in one region of the gate insulating layer 113 and having a size corresponding to a width of the active layer 112a, an interlayer insulating layer 115 formed on the gate electrode 114, source and drain electrodes 116a and 116b formed on the interlayer insulating layer 115, and a planarization layer 117 formed on the source and drain electrodes 116a and 116b.

Also, the first substrate 100 further includes a first electrode 118 formed on the planarization layer 117, a pixel defining layer 125 having an opening exposing a region of the first electrode 118, an organic emission layer 119 formed on the pixel defining layer 125, and a second electrode 120 formed on the pixel defining layer 125 and the organic emission layer 119.

Here, the first and second electrodes 118 and 120 and the organic emission layer 119 formed therebetween constitute an organic light emitting element E.

The pixel defining layer 125 is patterned on the planarization layer 117 to have a hole h having a predetermined depth in a particular region excluding the opening exposing the first electrode 118. In one example, the hole h and the organic light emitting element E (or the recessed area thereof) do not overlap. The hole h of the pixel defining layer 125 is formed in a region that corresponds to the non-light emitting unit 150a of the display region 101.

The second electrode 120 of the organic light emitting element E is patterned to expose the hole h of the pixel defining layer 125 and formed on the first substrate 100.

Meanwhile, the organic light emitting display device according to an embodiment of the present invention further includes a first seal 300 for sealing the first and second substrates 100 and 200 and a second seal 400 formed in the display region 101 to enhance the mechanical strength of the first and second substrates 100 and 200. Although the term "second seal" is used in the present disclosure, the term may be replaced with a support, a spacer, or any other term that may be appropriate for describing an element configured to provide support to the first and second substrates 100 and 200.

The first seal 300 may be formed of frit made of a transparent material to block an introduction of moisture and oxygen from the outside and forms a rectangular closed loop surrounding the display region 101 of the first substrate 100.

Frit originally refers to a powder type glass material including an additive; however, since frit may also generally refer to glass formed by melting frit in a glass technical field, the term as used herein covers both concepts.

The second seal 400 may also be formed of frit, like the first seal 300. The second seal 400 is formed in the non-light emitting unit 150a of the display region 101 of the first substrate 100 to serve to enhance mechanical strength of the first and second substrates 100 and 200. As a result, better blocking of the introduction of moisture and oxygen from the outside may be achieved.

The second seal 400 is inserted into the hole h formed in the pixel defining layer 125 through a printing method, or the like, to support the first and second substrates 100 and 200, and at least two or more holes h may be formed in the display region 101 of the first substrate 100. The second seal 400 may be formed in the hole h formed in the pixel defining layer 125 through a photolithography process using a halftone mask.

Since the second seal 400 is inserted in the hole h formed in the pixel defining layer 125 to support the first and second substrates 100 and 200, the bonding surface between the first seal 300 and the first and second substrates 100 and 200 is less likely to be damaged, and the introduction of oxygen and moisture to the organic light emitting element E from the outside may be more effectively blocked.

In addition, the second seal 400 lessens the external impact applied to the first and second substrates 100 and 200 to a degree, enhancing the mechanical strength of the first and second substrates 100 and 200.

Hereinafter, a method for manufacturing an organic light emitting display device according to an embodiment of the present invention will be described in detail.

FIGS. 3A through 3G are cross-sectional views sequentially illustrating a process of manufacturing the organic light emitting display device of FIG. 2.

Figure 3A:
FIGS. 3A through 3G are cross-sectional views sequentially illustrating a process of manufacturing the organic light emitting display device of FIG. 2.

Referring to FIG. 3A, the buffer layer 110 is formed on the first substrate 100, and the semiconductor layer 112 is formed in one region of the buffer layer 110. The semiconductor layer 112 includes the active layer 112a and the source and drain regions 112b and 112c, and is formed by performing an ion doping process in a predetermined region of the buffer layer 110.

A material having excellent mechanical strength or dimensional stability may be used to form the first substrate 100. The first substrate 100 may comprise, for example, a glass plate, a metal plate, a ceramic plate, plastic (a polycarbonate resin, an acrylic resin, a polyvinyl chloride, a polyethyleneterephthalate resin, a polyimide resin, a polyester resin, an epoxy resin, a silicon resin, a fluoride resin, and the like), and the like, but the present disclosure is not limited thereto.

The buffer layer 110 may be formed to protect the driving elements formed in a follow-up process from impurities such as an alkali ion, or the like, effused from the first substrate 100, and may be omitted depending on the material of the first substrate 100.

Figure 3B:
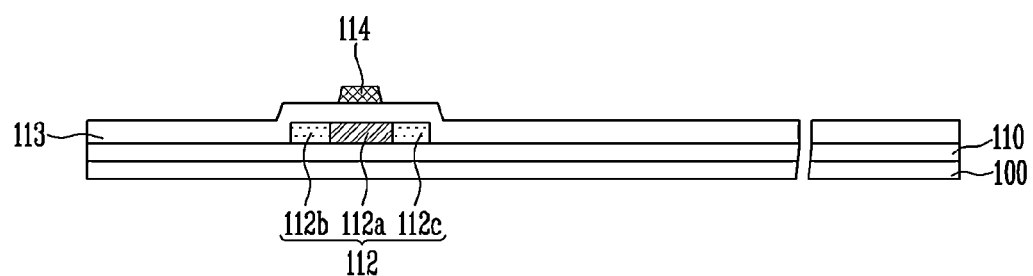

Subsequently, as illustrated in FIG. 3B, the gate insulating layer 113 is formed on the first substrate 100, and the gate electrode 114 is formed in a region of the gate insulating layer 113 corresponding to the active layer 112a.

The gate insulating layer 113 is formed as a silicon oxide film (SiOx), a silicon nitride film (SiNx), or a dual-layer including the silicon oxide film (SiOx) and the silicon nitride film (SiNx), and serves to insulate the gate electrode 114 and the semiconductor layer 112 positioned in lower and upper portions thereof.

The gate electrode 114 may be formed of a type of material selected from the group consisting of aluminum (Al), an aluminum alloy, tungsten (W), molybdenum (Mo), chromium (Cr), titanium (Ti), and the like, as a conductive metal.

Figure 3C:
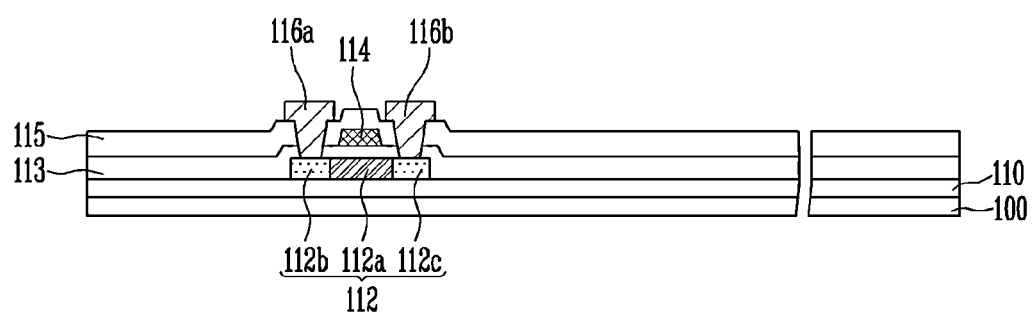

Subsequently, as illustrated in FIG. 3C, the interlayer insulating layer 115 is formed on the gate insulating layer 113 and the gate electrode 114, and through holes are formed in at least one region of the gate insulating layer 113 and the interlayer insulating layer 115. The source and drain electrodes 116a and 116b connected to the source and drain regions 112b and 112c are formed in the through holes.

The source and drain electrodes 116a and 116b may be formed of one or more types of material selected from the group consisting of chromium (Cr), molybdenum (Mo), tungsten (W), molybdenum-tungsten (MoW), titanium (Ti), aluminum (Al), an aluminum alloy, and the like.

Figure 3D:
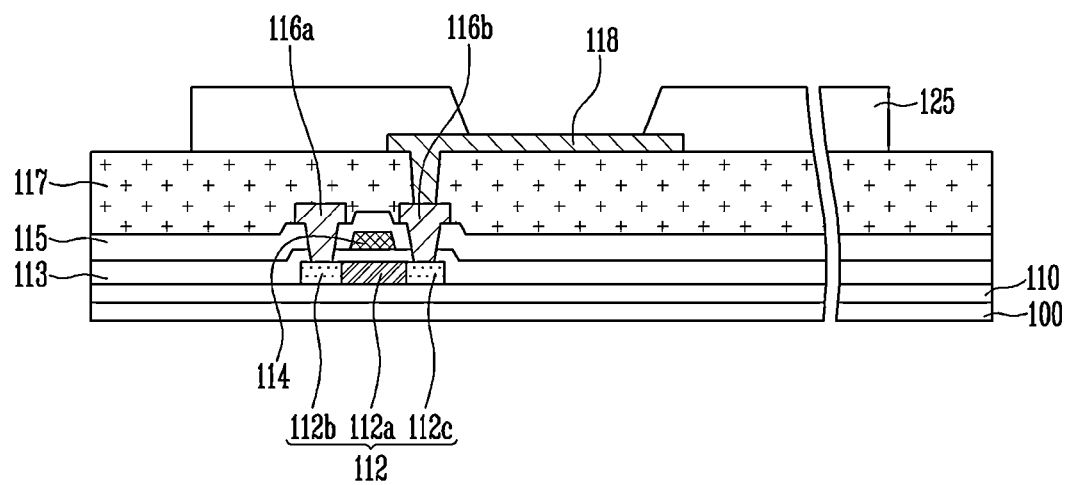

Subsequently, as illustrated in FIG. 3D, the planarization layer 117 serving as a protective film protecting the source and drain electrodes 116a and 116b is formed on the first substrate 100 over the source and the drain electrodes 116a and 116b formed thereon. The planarization layer 117 may include an inorganic protective film formed as at least one of a silicon nitride film (SiNx) and a silicon oxide film (SiOx).

The first electrode 118 electrically connected to the drain electrode 116b is formed on the first substrate 100 over the planarization layer 117 formed thereon. The first electrode 118 refers to an anode electrode of the organic light emitting element (E in FIG. 2) and may be formed of an inorganic film material.

The pixel defining layer 125 is formed on the planarization layer 117 over the first electrode 118 formed thereon. The pixel defining layer 125 includes an opening through which a partial region is exposed through a photolithography process.

Preferably, the pixel defining layer 125 is formed of an organic film material selected from the group consisting of a polyacrylic resin, an epoxy resin, a phenol resin, a polyamide-based resin, a polyimide-based resin, an unsaturated polyester-based resin, a polyphenylenether-based resin, a polyphenylenesulfide-based resin, and benzocyclobutene.

Figure 3E:
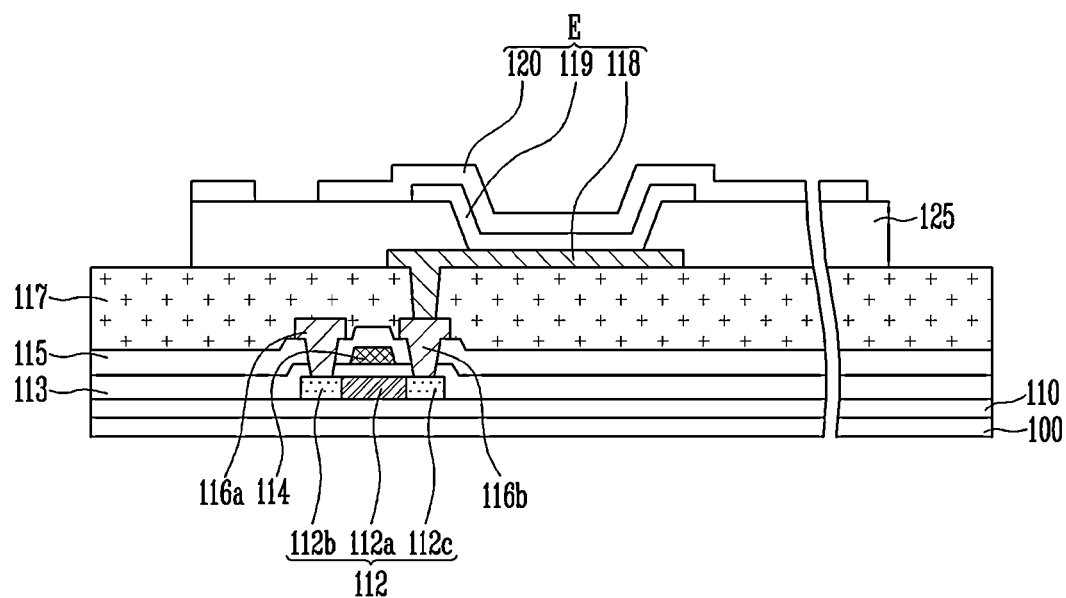

Subsequently, as illustrated in FIG. 3E, the organic emission layer 119 is formed on the opening of the pixel defining layer 125, and the second electrode 120 is formed on the organic emission layer 119.

A low molecular or high molecular organic film may be used as the organic emission layer 119. In the case of using a low molecular organic film, a hole injection layer (HIL), a hole transport layer (HTL), an emission layer (EML), an electron transport layer (ETL), an electron injection layer (EIL), and the like, may be stacked to form a single or complex structure.

The second electrode 120 serves as a cathode electrode. The polarities of the first and second electrodes 118 and 120 may be reversed.

In case of a bottom emission type display device in which an image is implemented in a direction of the first substrate 100, the first electrode 118 may be a transparent electrode and the second electrode 120 may be a reflective electrode. In this case, the first electrode 118 may be formed of ITO, IZO, ZnO, $In_2O_3$, or the like, having a high work function, and the second electrode 120 may include a reflective film formed of Ag, Mg, Al, Pt, Pd, Au, Ni, Nd, Ir, Cr, Li, Ca, and a compound thereof having a small work function and ITO, IZO, ZnO, $In_2O_3$, and the like, having a high work function. Also, the transparent electrode as the second electrode 120 may be formed by depositing a metal having a small work function, namely, Ag, Mg, Al, Pt, Pd, Au, Ni, Nd, Ir, Cr, Li, Ca, and a compound thereof and forming an auxiliary electrode layer or a bus electrode line formed of a transparent conductive material such as ITO, IZO, ZnO, and $In_2O_3$ thereon.

In case of a dual-type display device, both the first and second electrodes 118 and 120 may be formed as transparent electrodes.

The first and second electrodes 118 and 120 may not necessarily be formed of the foregoing materials, and may be formed of a conductive paste including a conductive organic material or conductive particles such as Ag, Mg, Cu, and the like. In the case of using a conductive paste, the conductive paste may be printed by using an inkjet printing method, and after the printing operation, the paste may be sintered to form an electrode.

The second electrode 120 in the first substrate 100 may be patterned to include an opening exposing a portion of the pixel defining layer 125. The opening of the second electrode 120 refers to a portion corresponding to the second seal 400 to be subsequently formed in the hole h of the pixel defining layer 125 in a follow-up process.

Figure 3F:
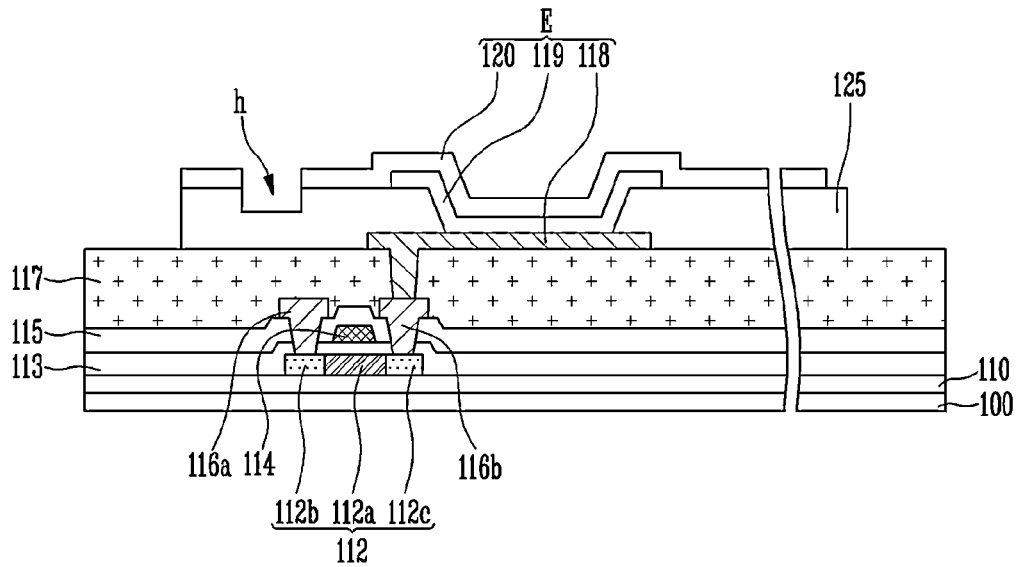

Subsequently, as illustrated in FIG. 3F, the hole h is formed in the pixel defining layer 125 in the first substrate 100 with the second electrode 120 patterned such that a portion thereof is open. The hole h of the pixel defining layer 125 is positioned in a region corresponding to the opening of the second electrode 120 and has a predetermined depth.

Figure 3G:
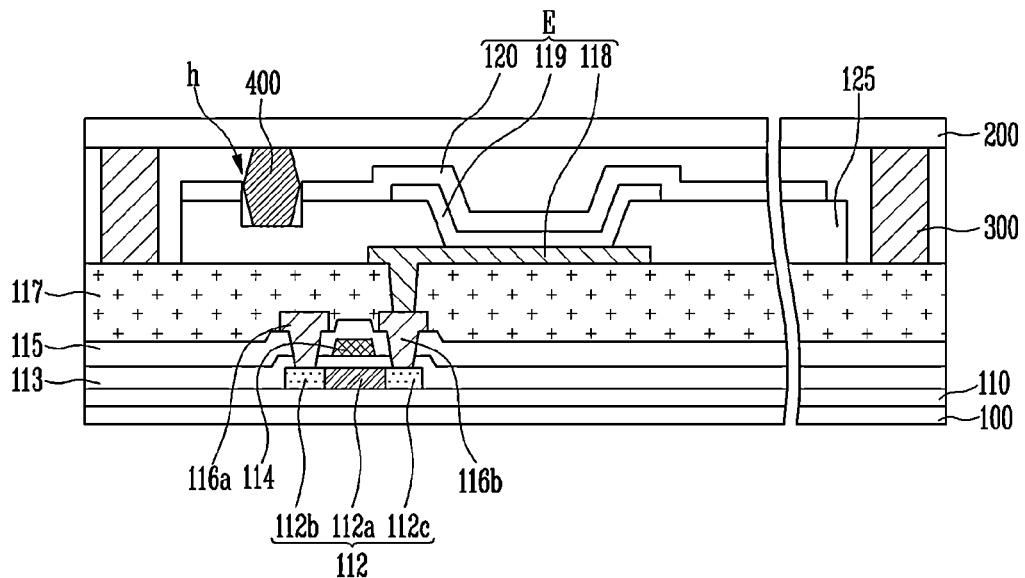

Subsequently, as illustrated in FIG. 3G the first seal 300 is formed on the edge of the first substrate 100 and seals the first and second substrates 100 and 200, and at the same time, the second seal 400 formed of the same material as that of the first seal 300 is inserted into the hole h of the pixel defining layer 125 and supports the first and second substrates 100 and 200.

The second seal 400 may be formed of frit. More than one second seal 400 may be formed, for example, by using a photolithography process using a half-tone mask, a printing method, and the like, and the number of the second seals 400 formed may correspond to the number of holes h provided in the pixel defining layer 125. In one embodiment, the number of the second seals 400 equals the number of the organic light emitting elements E formed in the display region 101. In another embodiment, one second seal 400 is formed for each organic light emitting elements E. In yet another embodiment, more than one second seal 400 is formed for each organic light emitting elements E.

In this case, a shape and size of the second seal 400 and an interval therebetween may be determined according to a structure of an organic light emitting display device.

As described above, in embodiments of the present invention, by forming the first and second seals 300 and 400 formed of frit between the two substrates 100 and 200, moisture, oxygen, and the like, which may be introduced from the outside, may be effectively blocked and impact applied from the outside may be reduced or eliminated, enhancing the mechanical strength of the substrates 100 and 200.

By way of summation and review, in the case of the organic light emitting display device and the method of manufacturing the same according to embodiments of the present invention, introduction of oxygen and moisture from the outside may be completely blocked and impact applied to the substrates may be reduced or eliminated to thus enhance the mechanical strength of the substrates.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display device comprising:
   a first substrate including a display region and a non-display region; a second substrate;
   an array corresponding to the display region of the first substrate and interposed between the first and second substrates, the array comprising a plurality of organic light emitting elements, each of which is surrounded by a pixel defining layer;
   a sealing member formed along the edges of the first and second substrates and interconnecting the first and second substrates;
   a plurality of recesses formed into the pixel defining layer of the array such that the plurality of recesses are distributed throughout the display region; and
   a plurality of reinforcing members inserted into the plurality of recesses such that the plurality of reinforcing members are distributed throughout the display region,
   wherein the array further comprises a common electrode formed over the pixel defining layer, the common electrode having a plurality of openings corresponding to the reinforcing members and formed through the common electrode of the array,
   wherein a first one of the plurality of reinforcing members comprises a first portion positioned in a first one of the plurality of recesses and a second portion projected outside the first one of the plurality of recesses toward the second substrate such that the second portion of the first one of the plurality of reinforcing members directly contacts and is capable of supporting the second substrate when the second substrate is pressed toward the first substrate by an external force.

2. The organic light emitting display device as claimed in claim 1, wherein the plurality of reinforcing members and the sealing member are formed of the same material.

3. The organic light emitting display device as claimed in claim 1, wherein the plurality of reinforcing members and the sealing member are formed of glass frit.

4. The organic light emitting display device as claimed in claim 1, wherein the plurality of reinforcing members are spaced apart from one another at a predetermined interval.

5. The organic light emitting display device as claimed in claim 1, wherein the plurality of reinforcing members are formed using a printing method.

6. The organic light emitting display device as claimed in claim 1, wherein the pixel defining layer is an organic material layer.

7. A method of making an organic light emitting display device of claim 1, the method comprising:
   providing an intermediate device comprising a first substrate, a second substrate, and an array of organic light emitting elements formed over the first substrate and interposed between the first and second substrates, the array comprising a pixel defining layer and a recess formed into the pixel defining layer;
   forming a reinforcing member comprising a first portion and a second portion such that the first portion is received in the recess and the second portion projects outside the recess toward the second substrate; and
   forming a sealing member along edges of the first and second substrates to interconnect the first and second substrates.

8. The method as claimed in claim 7, further comprising:
   irradiating laser to the sealing member and the reinforcing member.

9. The method as claimed in claim 7, wherein the reinforcing member and the sealing member are formed of the same material.

10. The method as claimed in claim 7, wherein the sealing member is formed of glass frit.

11. The method as claimed in claim 7, wherein the array comprises a second electrode, and the second electrode is patterned to include an opening formed in a portion corresponding to the reinforcing member.

12. The method as claimed in claim 7, wherein the reinforcing member is formed in a non-light emitting region of the first substrate on the pixel defining layer.

13. The method as claimed in claim 7, wherein two or more reinforcing members are formed to be spaced apart from one another at a predetermined interval on the pixel defining layer.

14. The method as claimed in claim 7, wherein the reinforcing member is inserted into the recess of the pixel defining layer using a printing method.

15. The method as claimed in claim 7, wherein forming the reinforcing member comprises placing a precursor of the reinforcing member made of glass frit and applying laser to the precursor.

16. The method as claimed in claim 15, wherein forming the reinforcing member and forming the sealing member are performed together.

17. The method as claimed in claim 16, wherein forming the reinforcing member and forming the sealing member are performed simultaneously.

* * * * *